United States Patent [19]

Ward

[11] 4,202,046
[45] May 6, 1980

[54] DATA STORAGE SYSTEM FOR STORING MULTILEVEL SIGNALS

[75] Inventor: William P. Ward, Poway, Calif.

[73] Assignee: NCR Corporation, Dayton, Ohio

[21] Appl. No.: 939,021

[22] Filed: Sep. 1, 1978

[51] Int. Cl.$^2$ .................. G11C 19/28; G11C 7/06
[52] U.S. Cl. ..................................... 365/222; 365/75; 365/183; 307/221 C
[58] Field of Search ................. 365/222, 183, 73, 75; 307/221 C, 221 D

[56] References Cited

U.S. PATENT DOCUMENTS

| 3,946,368 | 3/1976 | Chou | 365/222 |
| 3,999,171 | 12/1976 | Parsons | 365/73 |
| 4,085,459 | 4/1978 | Hirabayashi | 365/222 |

FOREIGN PATENT DOCUMENTS 2509567  9/1976  Fed. Rep. of Germany ........... 365/222

Primary Examiner—Stuart N. Hecker
Attorney, Agent, or Firm—J. T. Cavender; Edward Dugas; Stephen F. Jewett

[57] ABSTRACT

A data storage system for storing multilevel, non-binary data includes a charge coupled device (CCD) shift register and a detection circuit for detecting the data level represented by the charge or signal within each cell location of the CCD shift register. The detection circuit includes a sense amplifier for comparing the signals from two adjacent cell locations, with one signal representing a known data level. The comparison of adjacent cell locations compensates for signal losses during shifting, since the losses experienced by adjacent cell locations are nearly identical. Switching transistors cause the output of an incrementing digital-to-analog converter to be added to one of the signals prior to comparison. The output of the sense amplifier is provided to a flip-flop, which controls the switching transistors. The outputs of the sense amplifier and flip-flop are connected to an EXCLUSIVE NOR gate, whose output enables an up/down counter, which in turn provides the detected data level.

12 Claims, 7 Drawing Figures

| FOUR DATA LEVELS IN ONE CELL OF SHIFT REGISTER 12 | SAME DATA REQUIRING TWO CELLS OF BINARY SHIFT REGISTER |
|---|---|
| 0 | 00 |
| 1 | 01 |
| 2 | 10 |
| 3 | 11 |

| TIME | $BC_1$ | $BC_2$ | $V_{D/A}$ |
|---|---|---|---|
| $t_1$ | 0 | 0 | $V_a$ |
| $t_2$ | 0 | 0 | $V_a$ |
| $t_3$ | 0 | 1 | $1 + V_a$ |
| $t_4$ | 1 | 0 | $2 + V_a$ |
| $t_5$ | 1 | 1 | $3 + V_a$ |

FIG. 7

| | TIME | $b_0$ | $b_1$ | $Q$ | $\bar{Q}$ | $S_0$ | $S_1$ | SA | OUTPUT OF GATE 54 | DATA OUTPUT ($Q_U/D$) |
|---|---|---|---|---|---|---|---|---|---|---|
| CASE NO. 1 | $t_1$ | 0 | 0 | 0 | 1 | 0 | $V_a$ | 1 | | |
| | $t_2$ | | | 1 | 0 | $V_a$ | 0 | 0 | 0 | 0 |
| | $t_3$ | | | 1 | 0 | $1+V_a$ | 0 | 0 | 0 | 0 |
| | $t_4$ | | | 1 | 0 | $2+V_a$ | 0 | 0 | 0 | 0 |
| | $t_5$ | | | 1 | 0 | $3+V_a$ | 0 | 0 | 0 | 0 |
| CASE NO. 2 | $t_1$ | 0 | 2 | 0 | 1 | 0 | $2+V_a$ | 1 | | |
| | $t_2$ | | | 1 | 0 | $V_a$ | 2 | 1 | 1 | 1 |
| | $t_3$ | | | 1 | 0 | $1+V_a$ | 2 | 1 | 1 | 1 |
| | $t_4$ | | | 1 | 0 | $2+V_a$ | 2 | 0 | 0 | 2 |
| | $t_5$ | | | 1 | 0 | $3+V_a$ | 2 | 0 | 0 | 2 |
| CASE NO. 3 | $t_1$ | 3 | 0 | 0 | 1 | 3 | $V_a$ | 0 | | |
| | $t_2$ | | | 0 | 1 | 3 | $V_a$ | 0 | 1 | 3 |
| | $t_3$ | | | 0 | 1 | 3 | $1+V_a$ | 0 | 1 | 2 |
| | $t_4$ | | | 0 | 1 | 3 | $2+V_a$ | 0 | 1 | 1 |
| | $t_5$ | | | 0 | 1 | 3 | $3+V_a$ | 1 | 0 | 0 |

DATA STORAGE SYSTEM FOR STORING MULTILEVEL SIGNALS

BACKGROUND OF THE INVENTION

The present invention relates to a data storage system, and more particularly to the detection of multilevel data in a system having a shift register storage device.

Semiconductor charge-transfer devices, such as charge coupled devices (CCD's), are well known and have been used and proposed for use in various applications relating to the storage of data.

One problem associated with CCD's is the difficulty in reliably and accurately detecting the data stored in the device. A CCD operates much like a serial shift register, with the bits of information represented by charge packets serially shifted through the CCD. During the shifting, the CCD frequently experiences charge losses. The losses are affected by various considerations, and can vary from one device to another. For example, CCD's are sensitive to variations in temperature, clocking frequency and the physical dimensions within the device.

In the past, detection of data stored within a CCD has been accomplished by comparing the signal from each cell with an external reference signal. However, if significant cell-to-cell losses occur, such a comparison does not reliably detect the stored data. To minimize cell-to-cell losses, it is necessary that there be frequent regeneration of the data and that operating temperatures be kept within specified ranges, among other things. These constraints have increased the cost and physical size of CCD's and thus made them undesirable for many memory applications.

This problem is particularly acute in a multilevel, non-binary system where the signal from each cell represents one of three or more data levels. Unpredictable cell-to-cell losses make it very difficult to distinguish between several possible data levels by comparing the signal from each cell to an external reference signal. Even frequent regeneration and maintaining strict operating conditions has not made multilevel, non-binary data storage in CCD's feasible.

In co-pending U.S. application Ser. No. 930,613, entitled "DATA STORAGE SYSTEM," by William P. Ward, filed Aug. 3, 1978, there is disclosed a data storage system having a CCD shift register for storing binary data, with the data detected by comparing signals in adjacent storage cells of the CCD shift register. However, application Ser. No. 930,613 does not provide for a non-binary system, where three or more data signal levels may be stored in each storage cell.

SUMMARY OF THE INVENTION

In the present invention, a memory or data storage system having a shift register, such as a charge coupled device shift register, stores multilevel data and is provided with a detection circuit which detects the data levels of a first signal within a given cell by comparing the first signal with a second signal in an adjacent cell having a known data level. Since adjacent cells will normally experience nearly identical losses as they are shifted through the charge coupled device, the detection circuit in the present invention can provide a highly reliable and accurate means of determining the data level represented by the signal in each cell, even when high or uncertain cell-to-cell charge or signal losses are present.

With reliable detection of multilevel data, the bit density of a CCD in accordance with the present invention is considerably increased over prior binary CCD's. For example, in the disclosed embodiment, each storage cell in a CCD shift register stores one of four data levels. In a binary system, two storage cells would be required to store the same amount of information or data.

It is, therefore, an object of the present invention to provide an improved data storage system.

Another object of the present invention is to provide an improved CCD shift register device for storing multilevel data that can be reliably read despite cell-to-cell signal losses.

A further object of the present invention is to provide a CCD memory system that has bit density increased over prior CCD memory systems.

Still a further object of the present invention is to provide a detection circuit for reliably detecting the multilevel data stored in a shift register, such as a CCD shift register.

BRIEF DESCRIPTION OF THE DRAWINGS

FIG. 7 is a table illustrating, in three exemplary cases, the operation of the detection circuit of FIG. 3.

DESCRIPTION OF PREFERRED EMBODIMENT

Figure 1:
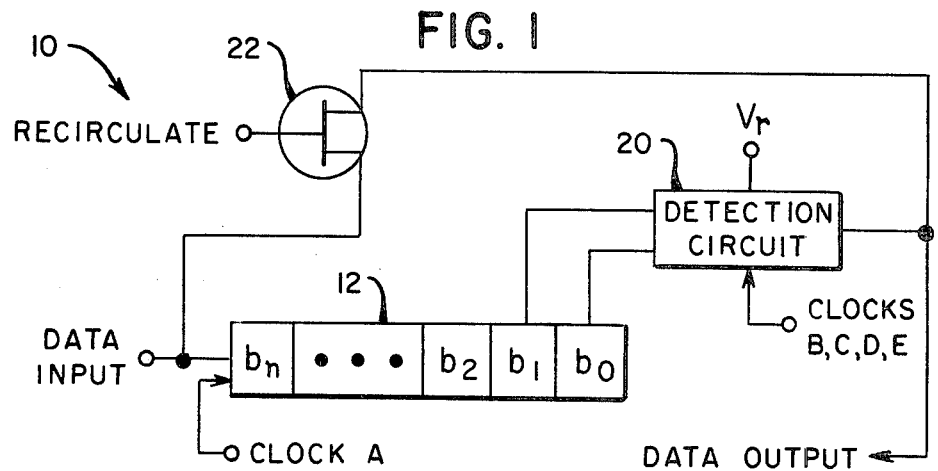
FIG. 1 illustrates a data storage system, including a shift register and detection circuit, in accordance with the present invention.

Referring now to FIG. 1, a data storage system 10 is illustrated. The data storage system 10 includes a charge transfer device, such as a charge coupled device (CCD) shift register 12. A CCD, as is well known, stores charges in potential wells, or packets, and moves or transfers the charge packets along a series of storage or cell locations from one cell to the next, in order to function as a serial shift register. For purposes of illustration, the shifting of data within shift register 12 is shown in FIG. 1 and the timing diagram of FIG. 6 as occurring upon application of each clock pulse in a CLOCK A signal. However, it will be appreciated by those skilled in the art that in a typical CCD, plural, multiphase clock pulses are applied in a well known manner to accomplish each shift or transfer of data from one cell to the next.

Figures 2, 4, 5:
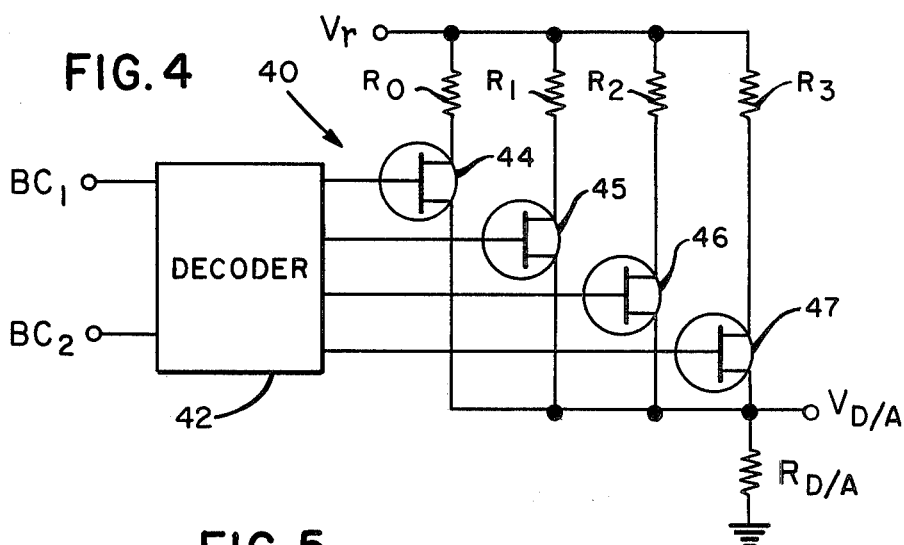
FIG. 2 is a table comparing the amount of data stored in a single cell of a shift register in accordance with the present invention, with the same amount of data requiring two cells in a binary shift register.
FIG. 4 is a circuit diagram illustrating the D/A converter of FIG. 3.
FIG. 5 is a table illustrating the operation of the D/A converter shown in FIG. 4.

The individual cells within the shift register 12 are labelled $b_o$ through $b_n$. The storage system 10 stores multilevel, non-binary data and, in the disclosed embodiment, each of the cells $b_o$ through $b_n$ stores one of four possible data levels, "0," "1," "2," or "3," and each data level is represented by a different signal or voltage value. It should be apparent that under this arrangement, the shift register 12 can store approximately twice as much data as a similar shift register storing binary data where each cell can store only one of two possible data levels. This is illustrated by the table of FIG. 2 wherein the four possible data levels capable of being stored in each cell of the shift register 12 are compared to the same amount of data requiring two cells of a binary shift register.

Although in the described embodiment only four data levels are stored in each cell of the shift register 12, it will be appreciated that almost any number of data levels could be stored in a single cell and be detected in accordance with the present invention. There are, of course, practical constraints in selecting the number of data levels, such as the need to limit the highest data level to the maximum voltage which the CCD can store without breakdown, and keeping a significant difference in the voltage values between successive data levels.

The two most rightward cell locations as viewed in FIG. 1, $b_0$ and $b_1$, are connected to the two data inputs of a detection circuit 20. The output of the detection circuit 20 provides, in a manner which will be discussed in greater detail later, the data level of the signal within cell location $b_1$ and regenerates that data level to its full signal or voltage value. The cell location $b_0$ is initially loaded with a reference or marker signal, and thus the shift register 12 can store a total of $n-1$ data digits plus a single marker digit. The marker digit is necessary because data level detection is accomplished in the system 10 by sensing the difference between the voltages or signals within the two adjacent cell locations $b_0$ and $b_1$, with the data level within cell location $b_0$ always known, either because initially it is the marker digit or because it was previously determined when in the cell location $b_1$. The marker digit value can be any one of the four possible data levels.

The output of the detection circuit is provided to the input of the shift register 12 by way of a field-effect transistor (FET) 22. When data is to be recirculated through the shift register, an enabling signal, designated "RECIRCULATE," is applied to the gate of FET 22. FET 22 becomes conductive and the data bit then at the $b_0$ cell, after having been regenerated by the detection circuit 20 to its full value, is passed through the FET 22 to the $b_n$ cell.

The detection circuit 20, in addition to receiving the data inputs from the cell locations $b_0$ and $b_1$, also receives clocking signals CLOCK B, CLOCK C, CLOCK D and CLOCK E, which will be described in greater detail later, and a reference voltage, designated $V_r$. The detection circuit 20 is illustrated in greater detail in FIG. 3.

Figure 3:
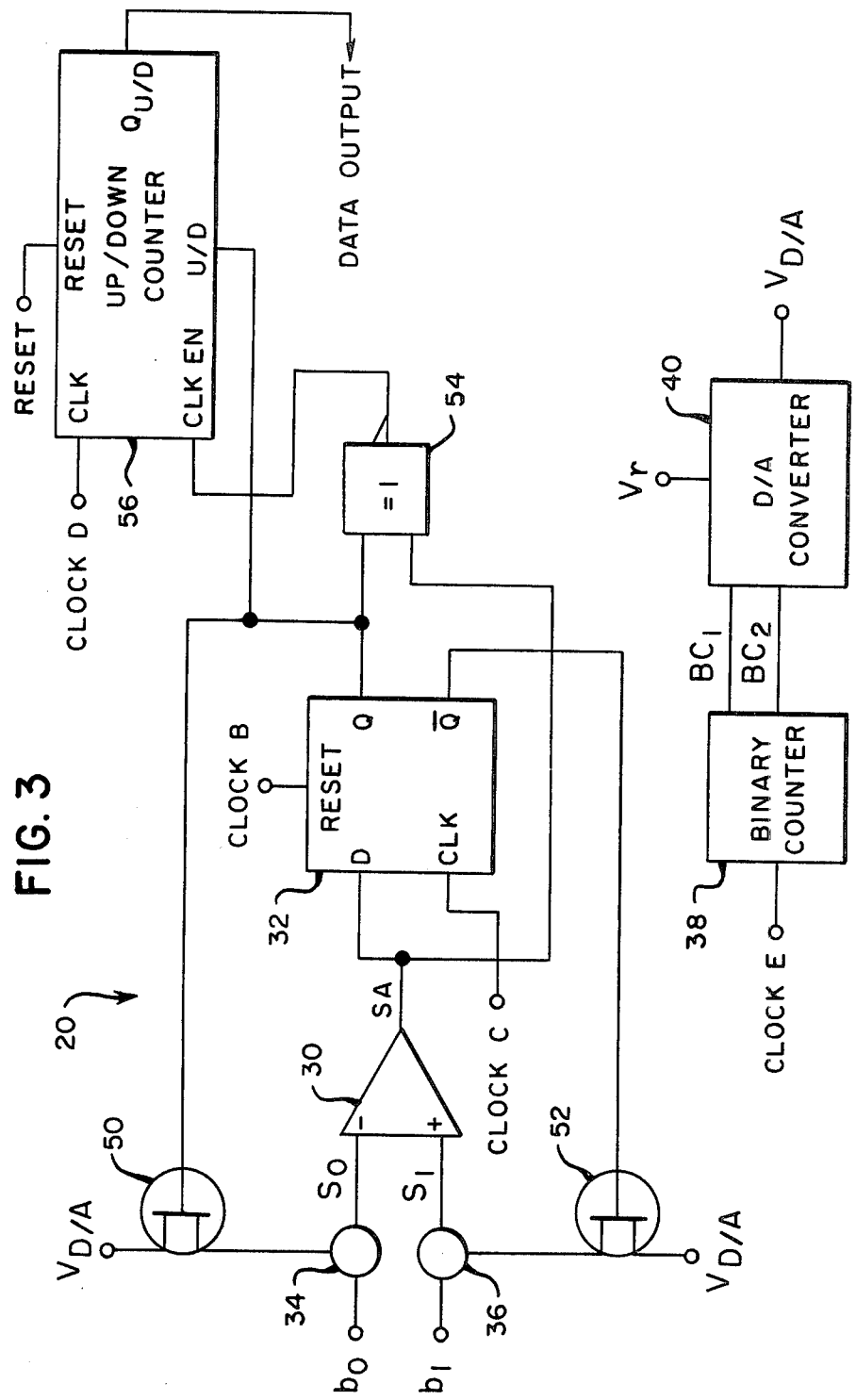
FIG. 3 is a block diagram illustrating the detection circuit of FIG. 1.

In FIG. 3, the detection circuit 20 is seen to include a sense amplifier 30 and a flip-flop 32. The amplifier 30 has a first, positive (+), input terminal and a second, negative (−), input terminal. The negative input terminal of the amplifier 30 is connected to the $b_0$ cell by a summing node 34 and the positive input terminal of the amplifier 30 is connected to the $b_1$ cell by a summing node 36. The signals from the summing nodes 34 and 36 are designated $S_0$ and $S_1$, respectively. The amplifier 30 can be a differential amplifier of conventional design that compares the signals $S_0$ and $S_1$, and at its output SA provides a "0" logic level signal if $S_0$ is larger and a "1" logic level signal if $S_1$ is larger.

The detection circuit 20 also includes a binary counter 38 and a digital-to-analog (D/A) converter 40. The D/A converter 40 receives the two outputs $BC_1$ and $BC_2$ of the binary counter 38 and also the reference voltage $V_r$. The binary counter 38 receives the clocking signal CLOCK E, and in response to each clock pulse in the CLOCK E signal, advances by one the binary number represented at its outputs $BC_1$ and $BC_2$. The D/A converter 40 converts the signals from the outputs $BC_1$ and $BC_2$ of the counter 38 into an incrementing adjustment signal at its output $V_{D/A}$ having values corresponding to each of the four possible data levels "0," "1," "2" and "3." The D/A converter 40 also adds a small, constant adjustment voltage $V_a$ to each of the data levels at its output $V_{D/A}$.

FIG. 4 illustrates in greater detail the D/A converter 40. The D/A converter includes a decoder 42 of conventional design that receives the signals $BC_1$ and $BC_2$ and has four outputs, each connected to the gate of one of four field-effect transistors (FET's) 44, 45, 46 and 47. Each of the FET's connects one of four resistors $R_0$, $R_1$, $R_2$ and $R_3$ to ground by way of a resistor $R_{D/A}$. The four resistors $R_0$, $R_1$, $R_2$ and $R_3$ are also connected, as shown, to the reference voltage $V_r$.

The operation of the D/A converter 40 will now be described with reference to FIG. 4 and the table in FIG. 5, which illustrates the values of the outputs $BC_1$ and $BC_2$ of counter 38 and the output $V_{D/A}$ of D/A converter 40 at times $t_1$, $t_2$, $t_3$, $t_4$ and $t_5$. The decoder 42 enables one of its outputs, and thus one of the FET's 44, 45, 46 and 47, in response to each of the four possible combinations of the signals at the outputs $BC_1$ and $BC_2$ of counter 38. The resistors $R_0$, $R_1$, $R_2$ and $R_3$ each form a voltage divider with the resistor $R_{D/A}$, and have values chosen to provide each of the four data levels (plus the adjustment voltage $V_a$) across the resistor $R_{D/A}$. Thus, at times $t_1$ and $t_2$, when $BC_1$ and $BC_2$ are both at "0" and FET 44 is conductive, the voltage $V_{D/A}$ across resistor $R_{D/A}$ is at $V_a$. At time $t_3$, FET 45 is conductive and $V_{D/A}$ is at the data level "1" plus $V_a$; at time $t_4$, FET 46 is conductive and $V_{D/A}$ is at the data level "2" plus $V_a$; and at time $t_3$, FET 47 is conductive and $V_{D/A}$ is at the data level "3" plus $V_a$. It can be seen from FIGS. 4 and 5 and the timing diagram of FIG. 6, that the CLOCK E signal includes a clock pulse at times $t_3$, $t_4$ and $t_5$ to advance the counter 38 and D/A converter 40, and at time $t_1$ to return the counter 38 to zero and the output of the D/A converter 40 to $V_a$.

Referring again to FIG. 3, the summing nodes 34 and 36 are connected to the output $V_{D/A}$ of the D/A converter by field effect transistors (FET's) 50 and 52, respectively. The gate of the FET 50 is connected to the output Q of the flip-flop 32 and the gate of the FET 52 is connected to the inverted output $\overline{Q}$ of the flip-flop 32. The reason for the connection of the FET's 50 and 52 to the flip-flop 32 and the need for the adjustment voltage $V_a$ will become apparent later when the operation of the detection circuit 20 is described. Briefly, however, the flip-flop 32 causes the incrementing output $V_{D/A}$ of the D/A converter 40 to be summed to the signal from the cell $b_0$ or $b_1$ which is at the lower data level. The adjustment voltage $V_a$ compensates for any cell-to-cell losses between $b_0$ and $b_1$. If $b_0$ and $b_1$ are at the same data level, or if $S_0$ and $S_1$ are at the same data level after the summing of $V_{D/A}$ to one of the cells $b_0$ and $b_1$, the adjustment voltage $V_a$ causes the signal to which it is summed to be the larger of the signals sensed by amplifier 30.

Although the signal losses experienced by the signals in two adjacent cells are nearly identical, there will normally be a very small loss from cell-to-cell and $V_a$ must have a value at least slightly greater than the worst case cell-to-cell loss that could be present between $b_0$ and $b_1$. For a typical CCD, assuming the difference in voltage or signal value between each of the four data levels is the same, a satisfactory value for $V_a$ would be one-half the difference between each of the full voltage values. It should be noted, however, that $V_a$ should not exceed the difference between each of the full voltage values of the four data levels. Otherwise, an erroneous comparison could be made by amplifier 30.

The flip-flop 32 receives the CLOCK B signal at its reset input, which resets the flip-flop to a "0" when the reading of the cell $b_1$ is initiated. The flip-flop 32 also receives the CLOCK C signal at its clock (CLK) input which clocks into a flip-flop the data level (either a "0" or a "1") from the output SA of amplifier 30.

The output SA of the amplifier 30 and the output Q of the flip-flop 32 are connected to the inputs of an EX-CLUSIVE NOR control gate 54. The output of gate 54 provides an enable control signal and is connected to the clock enable (CLK EN) input of an up/down counter 56. The counter 56 receives the CLOCK D signal at its clock (CLK) input, a reset signal at its reset input, and the signal from the output Q of flip-flop 32 at its up/down (U/D) input. The up/down counter 56 will count, in response to the clock pulses of CLOCK D, through the four data levels "0," "1," "2" and "3," which will appear at its output $Q_{U/D}$ at their full signal or voltage values. The signal at $Q_{U/D}$ at the end of each read cycle will be the data level of the signal in the $b_1$ cell. The clock enable input enables the counter when it receives a "1" from the output of gate 54. When a "0" is received from output of gate 54, the counter 56 is disabled and does not count in response to the clock pulses of CLOCK D.

The reset input of counter 56 is used to reset the counter to the same data level as the marker signal or digit when the marker digit reaches the cell $b_0$. The reset signal can be generated by a source external to the detection circuit 20, such as a memory controller, or the detection circuit can include an additional counter circuit (not shown) responsive to each cell-to-cell shift within the shift register 12 so that each time the marker digit reaches $b_0$ the additional counter circuit generates a signal to reset the counter 56. While the shift register 12 is mentioned as only having one marker digit, it should be appreciated that more than one marker digit could be located at spaced apart cells along the shift register, and that the up/down counter 56 could be reset each time one of the marker digits reaches the $b_0$ cell.

The operation of detection circuit 20 will now be described with reference to FIGS. 3 and 6. The detection circuit is initialized when the marker digit is in the $b_0$ cell. If the marker digit has been given, for example, a data level of "0," the up/down counter 56 is reset so that a "0" data level signal appears at the output $Q_{U/D}$ of counter 56.

Figure 6:
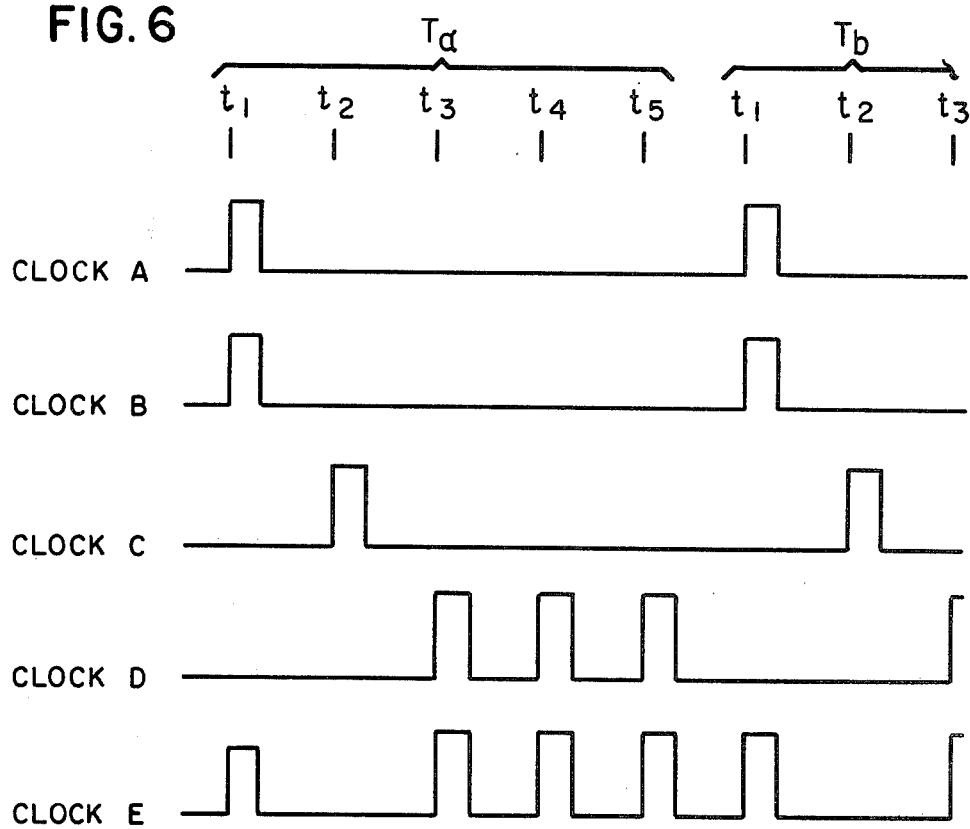
FIG. 6 is a timing diagram illustrating the clock pulses applied to the data storage system, including the detection circuit, of FIG. 1.

In FIG. 6 there is illustrated the signals CLOCK A, B, C, D and E and their occurrence during a first read cycle $T_a$ and a portion of a second read cycle $T_b$. Each read cycle is marked at five moments, designated times $t_1$ through $t_5$. At time $t_1$, the clock pulse in the CLOCK A signal shifts the data in the shift register so that the signal formerly in the $b_1$ cell is now in the $b_0$ cell. The data level of the signal in $b_0$ is now known, either because it is a marker digit or because its level was previously determined when it was in $b_1$. Also at time $t_1$, the clock pulse in the CLOCK B signal resets flip-flop 32 (FIG. 3) so that a "0" and "1" appear at its outputs Q and $\overline{Q}$, respectively, and the clock pulse in the CLOCK E signal returns binary counter 38 to zero.

During the interval between times $t_1$ and $t_2$ the amplifier 30 compares the signals $S_0$ and $S_1$. Since Q is at "0" and FET 50 is not conductive, $S_0$ will have the same value as $b_0$. On the other hand, $\overline{Q}$ is at "1" and FET 52 is conductive and causes the voltage $V_{D/A}$, then at its initial value of $V_a$, to be added to the value of $b_1$ at summing node 36. The output SA of amplifier 30 will be either a "0" or "1," depending upon whether $S_0$ or $S_1$ is larger. At time $t_2$ the output SA of amplifier 30 is clocked into the flip-flop by the clock pulse in the CLOCK C signal.

In the interval between times $t_2$ and $t_3$ the amplifier 30 again compares $S_0$ and $S_1$, with the output $V_{D/A}$ (still having a value of $V_a$) being added to either $b_0$ or $b_1$, depending on the signals at the outputs Q and $\overline{Q}$ of flip-flop 32. Still in the same interval, the output SA of amplifier 30 and the output Q of flip-flop 32 are received by the EXCLUSIVE NOR gate 54. If $b_0$ and $b_1$ are at the same data level, then output SA will be at a "0" and output Q will be at a "1" and the output of gate 54 goes to a "0." The "0" at the output of gate 54 is applied to the CLK EN input to disable the up/down counter 56. On the other hand, if $b_0$ is greater than $b_1$, outputs SA and Q will both be at "0," and if $b_0$ is less than $b_1$, outputs SA and Q will both be at "1," with either condition causing the output of gate 54 to go to a "1." The "1" at the output of gate 54 is applied to the CLK EN input to enable the up/down counter 56.

Still in the same interval between $t_2$ and $t_3$, the output Q of flip-flop 32 is also applied to the U/D input of counter 56 and determines whether counter 56 will count up or count down from the data level then present at its output $Q_{U/D}$. The data level at its output will be the same as the data level in the cell $b_0$. If Q is at a "1," the counter 56 will count up; and if Q is at a "0," the counter 56 will count down.

At times $t_3$, $t_4$ and $t_5$, clock pulses in the CLOCK D signal are applied to the CLK input of counter 56, and clock pulses in the CLOCK E signal are applied to the binary counter 38 to advance the D/A converter 40. The output $V_{D/A}$ of the D/A converter 40 is applied during each of these times to the same one of either summing node 34 or summing node 36, depending on the signals at outputs Q and $\overline{Q}$ of flip-flop 32. The outputs Q and $\overline{Q}$ control FET's 50 and 52 so that FET 50 is conductive at times $t_3$, $t_4$ and $t_5$ if the data level in $b_1$ is greater than the data level in $b_0$, and FET 52 is conductive if the data level in $b_0$ is greater than the data level in $b_1$.

The output $Q_{U/D}$ of up/down counter 56 can either increment or decrement upon each of the clock pulses in the CLOCK D signal. However, when the output $V_{D/A}$ of the D/A converter increments to such a value that, when added to the smaller of $b_0$ and $b_1$, the resulting signal exceeds the larger of $b_0$ and $b_1$, the output SA of amplifier 30 changes, and the output of gate 54 goes to a "0." Up/down counter 56 is then disabled by the "0" at its CLK EN input before the next clock pulse in the CLOCK D signal is applied, and the output $Q_{U/D}$ is then at the same data level as the signal in $b_1$ and remains at that data level until the next read cycle, $T_b$ (FIG. 6).

At the first time $t_1$ of the next read cycle $T_b$, data is shifted in the shift register 12 by the CLOCK A signal and the flip-flop 32 is again reset by the CLOCK B signal. At the same time, the binary counter 38 receives a clock pulse in the CLOCK E signal so that its outputs $BC_1$ and $BC_2$ return to a binary zero.

The remainder of the operation of the detection circuit 20 in the read cycle $T_b$ proceeds in the same fashion as the operation in the first read cycle $T_a$.

To illustrate the operation of the detection circuit 20 by way of example, the table of FIG. 7 shows, for three different cases, the values of $b_0$, $b_1$, Q, $\overline{Q}$, $S_0$, $S_1$, SA, the output of gate 54, and the Data Output of the detection circuit.

Referring now to FIG. 7, in connection with the circuit of FIG. 3 and the timing diagram of FIG. 6, in Case No. 1 the signals in both $b_0$ and $b_1$ are at a "0." At time $t_1$, Q is reset to a "0" by the CLOCK B signal and the output $V_{D/A}$ of the D/A converter 40 (then at a value of $V_a$) is added to $b_1$ at summing node 36. The output SA of amplifier 30 goes to a "1" since $S_1$ is greater than $S_0$. At time $t_2$, the "1" from SA is clocked into flip-flop 32, and thus Q is at a "1." $V_a$ is then added to $b_0$ at summing node 34 and the output SA goes to a "0," since $S_0$ is now greater than $S_1$. The output of gate 54 goes to a "0" and disables the up/down counter 56. Thus, while the D/A converter 40 increments, increasing the value of $S_0$, the output $Q_{U/D}$ of up/down counter 56 (also the Data Output) remains at its original $b_0$ data level of "0," indicating that $b_1$ is also at a "0."

In Case No. 2 of FIG. 7, $b_0$ is at a "0" and $b_1$ is at a "2." At time $t_1$, Q is reset to "0," $S_0$ is thus at a "0," and the output $V_{D/A}$ of the D/A converter 40 (then at a value of $V_a$) is summed with $b_1$ to give $S_1$ a value of $2+V_a$. Since $S_1$ is greater than $S_0$, the output SA of amplifier 30 goes to a "1," which is clocked into flip-flop 32 and appears at Q at time $t_2$. The $V_a$ at the output of the D/A converter 40 is then added to $b_0$, so that $S_0$ is at $V_a$ and $S_1$ is at "2." The output SA goes to a "1" and in turn the output of gate 54 goes to a "1" which enables the up/down counter 56. With Q at a "1," the counter 56 will increment. The D/A converter increments at time $t_3$ to "$1+V_a$" and then at time $t_4$ to "$2+V_a$," which causes the value of $S_0$ to finally exceed the value of $S_1$. SA will then go to "0," and the output of gate 54 goes to a "0," disabling the counter 56 so that the final value of the Data Output is "2." The one further increment of the D/A converter at time $t_5$ causing $S_0$ to go to $3+V_a$ has no effect on the up/down counter 56.

In Case No. 3, $b_0$ is at a "3" and $b_1$ is at a "0." Since $S_1$ is less than $S_0$ at time $t_1$, Q will remain at "0" at time $t_2$ and thereafter, causing the counter 56 to count down. The output of gate 54 is at a "1" at times $t_2$, $t_3$ and $t_4$, enabling the counter 56 to decrement until after the Data Output goes to "0" at time $t_5$.

It can thus be seen that the value of the signal in the $b_1$ cell is determined by comparing the signals from the $b_0$ and $b_1$ cells, with the value of $b_0$ being known, either because it has the value of a marker digit and the up/down counter 56 has been reset to such value, or it has the value of the signal just shifted from the $b_1$ cell, and the value of such signal is at the Data Output of the counter 56 from the previous read cycle. In either case, the determination of what data level is represented by the signal from the $b_1$ cell is made by comparison with the known signal from the $b_0$ cell, rather than with an external reference voltage, as is commonly done in the prior art. A reliable determination is made even if large or unknown signal losses are experienced during shifting, as long as the signals representing the four data levels are not completely dissipated before they reach the $b_1$ cell.

Although the presently preferred embodiment of the invention has been described, it will be understood that within the purview of this invention various changes may be made within the scope of the appended claims.

What is claimed is:

1. In a memory system having a charge transfer device shift register with a plurality of storage cells, with each storage cell for storing a signal having a value representing one data level of multilevel, non-binary data, a detection circuit for detecting the data level represented by the value of the signal in one of said storage cells, comprising:
   comparison means for comparing the value of the signal in said one storage cell with the value of the signal in an adjacent storage cell representing a known data level, and having an output for indicating which of the signals has a greater value;
   summing means for summing an incrementing adjustment signal to one of the signals in said one storage cell and said adjacent storage cell prior to being compared by said comparison means, the incrementing adjustment signal being summed to the one of the signals in said one storage cell and said adjacent storage cell having a lower value;
   means for receiving the output of said comparison means and for providing an enable control signal for indicating when the sum of the incrementing adjustment signal and the one of the signals having the lower value becomes greater than the other of the signals in said one storage cell and said adjacent storage cell; and
   means for receiving the enable control signal and for initially storing a signal having a value representing the same known data level as the signal in said adjacent storage cell and for incrementally changing the value of the initially-stored signal until receipt of the enable control signal, so that the initially stored signal then has a value representing the same data level as the value of the signal in said one storage cell.

2. The memory system of claim 1 wherein said charge transfer device shift register includes a storage cell storing a reference signal and wherein said means for receiving the enable control signal includes means for resetting the initially-stored signal to the value of the reference signal.

3. The memory system of claim 1 further including flip-flop means for storing the initial output of said comparison means and wherein said summing means comprises:
   a digital-to-analog converter having an output signal including a constant adjustment signal and the incrementing adjustment signal, with the incrementing adjustment signal having values corresponding to each of the data levels of the multilevel data;
   first summing node means for receiving the output signal of said converter and for adding the output signal of said converter to the signal from said one storage cell;
   second summing node means for receiving the output signal of said converter and for adding the output signal of said converter to the signal from said adjacent storage cell; and switching means controlled by said flip-flop means for selectively providing the output signal of said converter to said first and second summing nodes.

4. The system of claim 3, wherein said charge transfer device shift register comprises a CCD shift register.

5. The memory system of claim 3, wherein the constant adjustment signal has a value greater than the worst case cell-to-cell signal loss between said one and said adjacent storage cells and less than the difference between the full values of each of the data levels in said multilevel data.

6. In a memory system for storing multilevel data having a charge transfer device shift register with a plurality of storage cells, with each storage cell for storing a signal having a value representing one data level, a detection circuit for detecting the data level represented by the value of a first signal in one of said storage cells, comprising:

summing means for receiving the first signal in said one storage cell and a second signal in an adjacent storage cell having a value representing a known data level, and for summing an incrementally-changing signal to one of the first and second signals;

comparison means for comparing the value of the summed incrementally-changing signal and the one of the first and second signals to the value of the other of the first and second signals, and having an output for indicating which of the compared signal values is greater;

first storing means for storing the initial output of said comparison means;

control means for receiving the output from said comparison means and the initial output of said comparison means from said first storing means and providing a control output indicating when the output of said comparison means changes from its initial output; and second storing means for initially storing a signal having a value representing the same known data level as the second signal in said adjacent storage cell and for incrementally changing the value of the initially-stored signal, said second storing means controlled by the control output of said control means so that the initially-stored signal will be incrementally changed to a value representing the same data level as the value of the first signal in said one storge cell.

7. The memory system of claim 6 wherein said first storing means comprises flip-flop means and wherein said summing means comprises:

a digital-to-analog converter having an output providing the incrementally-changing signal, including a constant adjustment signal and an incrementing adjustment signal corresponding to each of the data levels of the multilevel data;

first summing node means for adding the output of said converter to the first signal from said one storage cell;

second summing node means for adding the output of said converter to the second signal from said adjacent storage cell; and switching means controlled by said flip-flop means for selectively connecting the output of said converter to one of said first and second summing nodes.

8. The memory system of claim 7, wherein said comparison means comprises a sense amplifier having a first, positive input terminal connected for receiving the output of said first summing node means and a second, negative input terminal for receiving the output of said second summing node means, and an output terminal, said sense amplifier comparing the signals at said first and second input terminals and providing a "1" logic level signal at said output terminal if the signal at said first input terminal is greater and a "0" logic level signal if the signal at said second input terminal is greater.

9. The memory system of claim 8 wherein said control means comprises an EXCLUSIVE NOR gate.

10. The memory system of claim 8, wherein said second storing means comprises an up/down counter having a clock enable input for receiving the control output of said control means and an up/down control input for receiving the output of said flip-flop means.

11. In a memory system having a charge transfer device shift register with a plurality of storage cells, with each storage cell for storing a signal having a value representing one of at least three data levels, a detection circuit for detecting the data level of the signal in one of said storage cells, comprising:

comparison means for comparing the signal in said one storage cell with the signal in an adjacent storage cell having a known data level;

summing means for adding a constant adjustment signal and an incrementally-changing adjustment signal to the signal in one of said storage cell and said adjacent storage cell prior to comparison by said comparison means; and storing means for initially storing a signal representing the same known data level as the signal in said adjacent storage cell and for incrementally changing the value of the initially stored signal corresponding to the incrementally-changing adjustment signal until the signal stored in said storing means has a value representing the same data level as the signal in said one storage cell.

12. The memory system of claim 11, wherein said charge transfer device shift register comprises a CCD shift register.

* * * * *